(12) United States Patent
Kim et al.

(10) Patent No.: US 12,580,592 B2
(45) Date of Patent: Mar. 17, 2026

(54) LDPC ENCODING AND DECODING METHOD

(71) Applicant: ELECTRONICS AND TELECOMMUNICATIONS RESEARCH INSTITUTE, Daejeon (KR)

(72) Inventors: Seok Ki Kim, Daejeon (KR); Nam Il Kim, Daejeon (KR); Sangbu Yun, Pohang-si (KR); Youngjoo Lee, Pohang-si (KR); Jeongwon Choe, Pohang-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 172 days.

(21) Appl. No.: 18/396,774

(22) Filed: Dec. 27, 2023

(65) Prior Publication Data

US 2024/0223214 A1     Jul. 4, 2024

(30) Foreign Application Priority Data

Dec. 28, 2022   (KR) ......................... 10-2022-0187624
Dec. 26, 2023   (KR) ......................... 10-2023-0191154

(51) Int. Cl.
*H03M 13/11*        (2006.01)
(52) U.S. Cl.
CPC ................................. *H03M 13/116* (2013.01)
(58) Field of Classification Search
CPC .................................................. H03M 13/116
See application file for complete search history.

(56) References Cited

U.S. PATENT DOCUMENTS 5,600,659 A *   2/1997   Chen ..................... H03M 13/13
                                                              714/752
7,120,856 B2   10/2006   Zhang et al.
(Continued)

OTHER PUBLICATIONS

Bertrand Le Gal et al., "High-throughput multi-core LDPC decoders based on x86 processor", IEEE Transactions on Parallel and Distributed Systems, vol. X, No. Y, Jan. 2015.
(Continued)

*Primary Examiner* — Joseph D Torres
(74) *Attorney, Agent, or Firm* — LRK PATENT LAW FIRM

(57)             ABSTRACT

A LDPC encoding method is provided, which is highly scalable and may support a variety of code cases and allow a high processing speed. The LDPC encoding includes: receiving an information sequence to be encoded; segmenting the information sequence into blocks of a predetermined length; deriving parity bits for each of the segmented blocks by using a predetermined parity check matrix; and generating a codeword by combining the parity bits into a corresponding segmented block. The operation of deriving parity bits for each of the segmented blocks includes: performing multiplications with at least one element of the parity check matrix by circularly shifting the segmented block a number of times corresponding to the at least one element of the parity check matrix; and performing XOR operations on a plurality of bits of a circularly-shifted segmented block in parallel.

15 Claims, 14 Drawing Sheets

(56) References Cited

U.S. PATENT DOCUMENTS

| | | | |
|---|---|---|---|
| 7,181,676 | B2 | 2/2007 | Hocevar |
| 7,539,920 | B2 | 5/2009 | Choi et al. |
| 7,590,914 | B2 | 9/2009 | Kim et al. |
| 8,539,304 | B1 * | 9/2013 | Shirali ................. H03M 13/116 |
| | | | 714/758 |
| 11,442,729 | B2 | 9/2022 | Ahn et al. |
| 2009/0158112 | A1 * | 6/2009 | Oh ....................... H03M 13/611 |
| | | | 714/752 |
| 2010/0005375 | A1 * | 1/2010 | Dell ........................ G06F 11/10 |
| | | | 714/E11.032 |
| 2022/0113969 | A1 | 4/2022 | Chang et al. |

OTHER PUBLICATIONS

Tram Thi Bao Nguyen et al., "Efficient QC-LDPC Encoder for 5G New Radio", Electronics 2019, 8, 668.
Lifang Wang, "Implementation of Low-Density Parity-Check codes for 5G NR shared channels", Degree Project in Computer Science and Engineering, Second Cycle, 30 Credits, Stockholm, Sweden 2021.
Yunke Tian et al., "Low-latency QC-LDPC encoder design for 5G NR", Sensors 2021, 21, 6266. https://doi.org/10.3390/s21186266.
Yi Xu et al., "AVX-512 Based Software Decoding for 5G LDPC Codes", 2019 IEEE International Workshop on Signal Processing Systems.

* cited by examiner

Figures 2, 3:
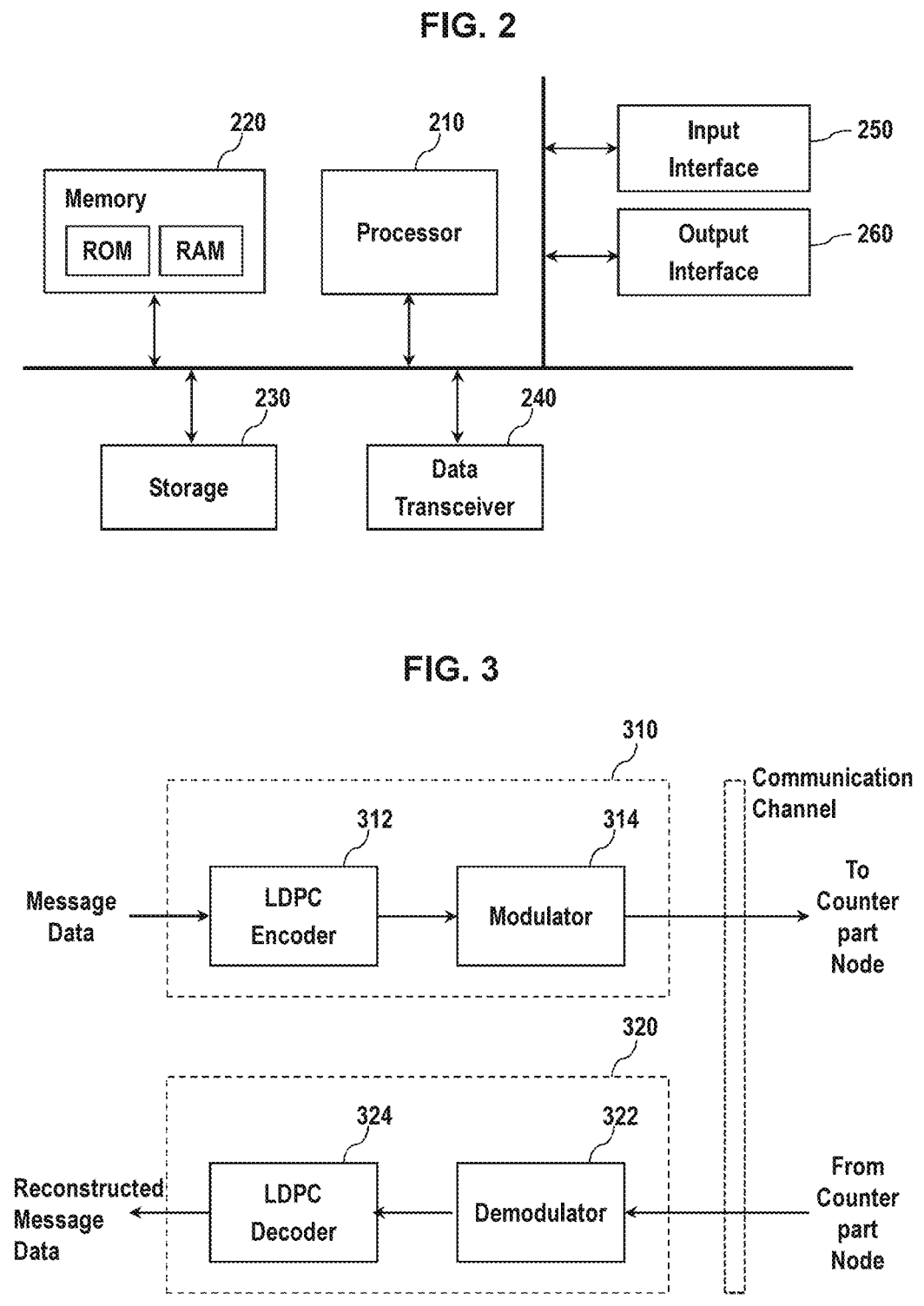

Memory — 220
ROM RAM

Processor — 210

Input Interface — 250

Output Interface — 260

Storage — 230

Data Transceiver — 240

Message Data → LDPC Encoder (312) → Modulator (314) → Communication Channel → To Counter part Node

320

Reconstructed Message Data ← LDPC Decoder (324) ← Demodulator (322) ← From Counter part Node

FIG. 7

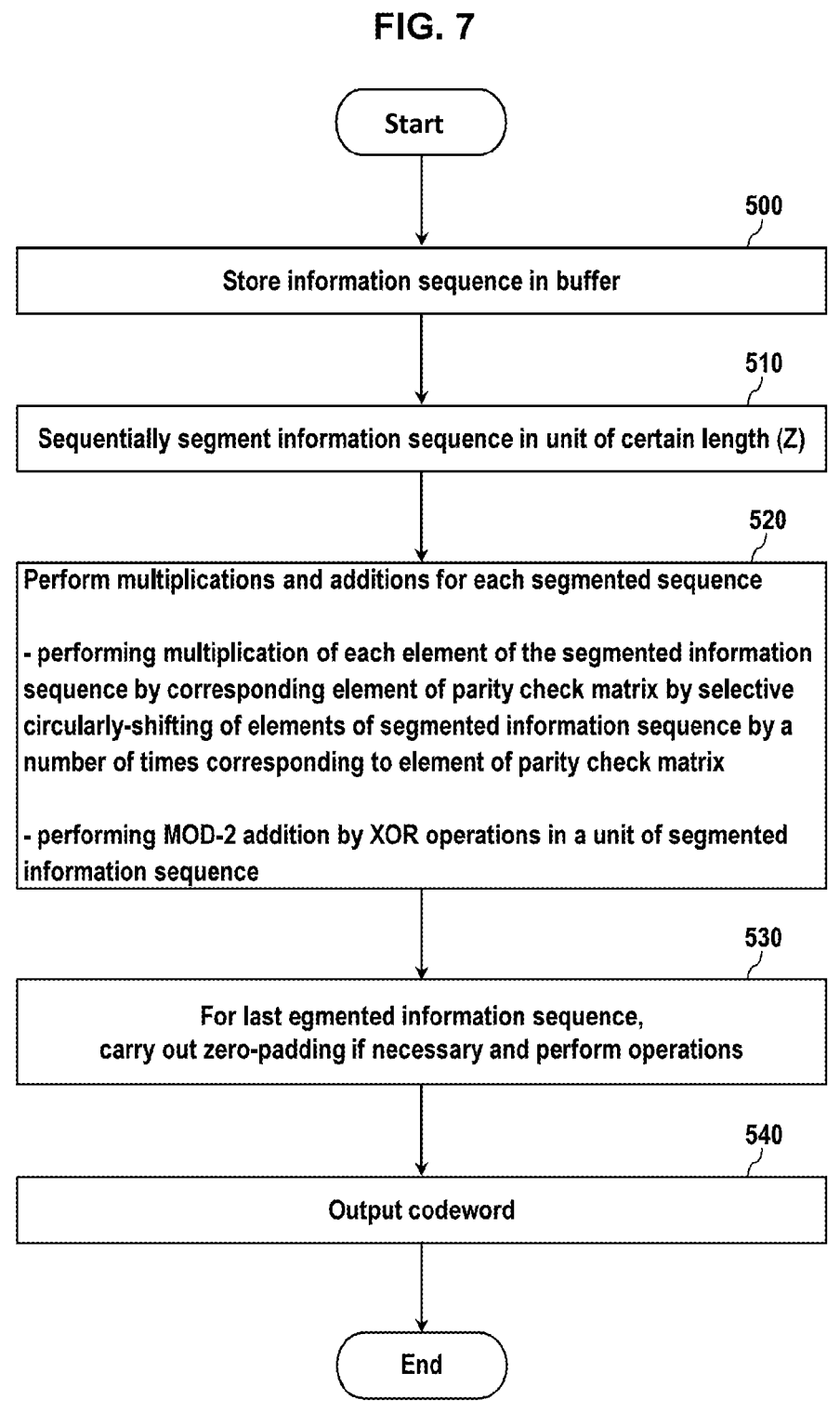

```
Start
```

↓

500

```
Store information sequence in buffer
```

↓

510

```
Sequentially segment information sequence in unit of certain length (Z)
```

↓

520

```
Perform multiplications and additions for each segmented sequence

- performing multiplication of each element of the segmented information
sequence by corresponding element of parity check matrix by selective
circularly-shifting of elements of segmented information sequence by a
number of times corresponding to element of parity check matrix

- performing MOD-2 addition by XOR operations in a unit of segmented
information sequence
```

↓

530

```
For last egmented information sequence,
carry out zero-padding if necessary and perform operations
```

↓

540

```
Output codeword
```

↓

```
End
```

Algorithm 2: Linear-time CNP implementation

---

```
fmin = (__m512i) *p_maxLLR;
smin = fmin;
sgn = vector_zero;
msign8 = vector_set1(0x80);
for i ← 1 to DEG do
    in = vector_abs(V2C_procBuf[i]);
    sgn = vector_xor(sgn, vector_and(V2C_procBuf[i],
      msign8));
    old_fmin = fmin;
    fmin = vector_min(fmin, in);
    smin = vector_min(smin, vector_max(in,
      old_fmin));
end
for i ← 1 to DEG do
    in = V2C_procBuf[i];
    psgn = vector_xor(sgn, vector_and(in, msign8));
    __mmask64 mask = vector_cmp(vector_abs(in),
      fmin);
    BM[BM_addr+i] = vector_psign(fmin, psgn);
    vector_mstore(BM+BM_addr+i, mask,
      vector_psign(smin, psgn));
end
```

---

LDPC ENCODING AND DECODING METHOD

CROSS-REFERENCE TO RELATED APPLICATIONS

The present application claims a convention priority under 35 U.S.C. § 119(a) based on Korean Patent Applications No. 10-2022-0187624 filed on Dec. 28, 2022, and No. 10-2023-0191154 filed on Dec. 26, 2023, the entire contents of which are incorporated herein in their entireties by reference.

BACKGROUND

1. Technical Field

The present invention relates to a data encoding and decoding method and, particularly, to an error correction coding and decoding method.

2. Description of Related Art

Channel coding is used to detect and correct an error introduced in a channel between a transmitter and a receiver. Various channel coding schemes are being used, such as Bose-Chaudhuri-Hocquenghem (BCH) code, convolutional code, turbo code, polar code, and low-density parity check (LDPC) code. In particular, the LDPC code is getting lots of attentions due to its excellent error correction capability and is being adopted as an optimal solution in various communication environments. For example, the 3rd generation partnership project (3GPP) technical specification (TS) 38.212 specifies the LDPC code as a channel coding scheme for shared channels of the 5th generation (5G) New Radio (NR) wireless communication system in consideration of the characteristics of LDPC code such as high throughput, low delay, low decoding complexity, and various coding rates.

Accordingly, researches have been actively conducted on hardware-based encoders and decoders based on the 5G NR standard, and a number of solutions suitable for specific communication situations have been proposed. However, the hardware-based encoders and decoders have low scalability allowing extensive processing parameters, and concerns on software-based encoders and decoders are increasing. Software-based encoders and decoders may be maintained and upgraded and allow a change of the system such as a change of parameters simply by updating the software without modifying an infrastructure. In addition, a low-cost or small system which cannot utilize or employ additional hardware for the error correction may perform the error correction coding simply by adding a software modem performed by a processor so as to ensure a significantly lower bit error rate compared with a case of communicating an uncoded bit stream.

However, conventional software-based encoders and decoders may not support all the code cases specified in the 5G NR standard, and thus may not fully achieve the scalability which is the most significant advantage of the software solutions. In addition, the software-based encoders and decoders may reveal limited performance in processing speed compared with the hardware solutions. Moreover, since a memory utilization efficiency greatly affects the performance in the processing speed, a data management technique is needed to minimize a cache miss penalty. Meanwhile, in the case of a software-based decoder that performs the decoding using Turbo Decoding Message Passing (TDMP) algorithm for data level parallelization, optimization, and reduction of computation amount, an error correcting performance is poorer than the existing layer-based decoding algorithm.

SUMMARY

Provided is a LDPC encoding method highly scalable, capable of supporting a variety of code cases, and allowing a high processing speed.

Provided is an LDPC encoding and decoding method allowing a high processing speed.

Provided is an LDPC encoding and decoding device suitable for performing the LDPC encoding and decoding method.

According to an aspect of an exemplary embodiment, a method of encoding data according to a low-density parity check code (LDPC) performed by a communication apparatus is provided. The data encoding method includes: receiving an information sequence to be encoded; segmenting the information sequence into blocks of a predetermined length; deriving parity bits for each of the segmented blocks by using a predetermined parity check matrix; and generating a codeword by combining the parity bits into a corresponding segmented block. The operation of deriving parity bits for each of the segmented blocks includes: performing multiplications with at least one element of the parity check matrix by circularly shifting the segmented block a number of times corresponding to the at least one element of the parity check matrix; and performing XOR operations on a plurality of bits of a circularly-shifted segmented block in parallel.

The operation of receiving the information sequence to be encoded may include: storing at least one of the segmented blocks of the predetermined length in a buffer through a vector operator supporting a data level parallelization.

The vector operator may be a SIMD LOAD instruction of an Advanced Vector Extension (AVX)-512 instruction set.

According to another aspect of an exemplary embodiment, a method of encoding and decoding data according to a low-density parity check code (LDPC) performed by a communication apparatus is provided. The data encoding and decoding method includes: receiving an information sequence to be encoded; segmenting the information sequence into blocks of a predetermined length; deriving parity bits for each of the segmented blocks by using a predetermined parity check matrix; generating a codeword by combining the parity bits into a corresponding segmented block; receiving a demodulated sample of a signal received through a predetermined channel; and decoding a demodulated sample. The operation of deriving parity bits for each of the segmented blocks includes: performing multiplications with at least one element of the parity check matrix by circularly shifting the segmented block a number of times corresponding to the at least one element of the parity check matrix; and performing XOR operations on a plurality of bits of a circularly-shifted segmented block in parallel.

The operation of receiving the information sequence to be encoded may include: storing at least one of the segmented blocks of the predetermined length in a buffer through a vector operator supporting a data level parallelization.

The vector operator may be a SIMD LOAD instruction of an Advanced Vector Extension (AVX)-512 instruction set.

The operation of decoding the demodulated sample may include: updating variable nodes based on LLR values obtained for a plurality of received blocks; determining one or more minimum values among a plurality of updated variable node values and updating check nodes; deriving an posterior probability (APP) value based on information about the one or more minimum values; and determining a decoding result based on the APP value.

The operation of determining the one or more minimum values and updating the check nodes may include: determining the one or more minimum values by executing a single instruction on a plurality of candidate blocks.

An execution of the single instruction on the plurality of candidate blocks may be performed by an execution of an SIMD MIN instruction of an AVX-512 instruction set.

According to yet another aspect of an exemplary embodiment, a device of encoding and decoding data according to a low-density parity check code (LDPC) in a communication apparatus is provided. The data encoding and decoding device includes: a processor; and a memory storing at least one instruction to be executed by the processor. The at least one instruction when executed by the processor causes the processor to: receive an information sequence to be encoded; segment the information sequence into blocks of a predetermined length; derive parity bits for each of the segmented blocks by using a predetermined parity check matrix; and generate a codeword by combining the parity bits into a corresponding segmented block. The instruction causing the processor to derive parity bits for each of the segmented blocks includes instructions causing the processor to: perform multiplications with at least one element of the parity check matrix by circularly shifting the segmented block a number of times corresponding to the at least one element of the parity check matrix; and perform XOR operations on a plurality of bits of a circularly-shifted segmented block in parallel.

The instruction causing the processor to receive the information sequence to be encoded may cause the processor to: store at least one of the segmented blocks of the predetermined length in a buffer through a vector operator supporting a data level parallelization.

The vector operator may be a SIMD LOAD instruction of an Advanced Vector Extension (AVX)-512 instruction set.

The at least one instruction when executed by the processor further may cause the processor to: receive a demodulated sample of a signal received through a predetermined channel; and decode a demodulated sample.

The instruction causing the processor to decode the demodulated may include instructions causing the processor to: update variable nodes based on LLR values obtained for a plurality of received blocks; determine one or more minimum values among a plurality of updated variable node values and updating check nodes; derive an posterior probability (APP) value based on information about the one or more minimum values; and determine a decoding result based on the APP value.

The instruction causing the processor to determine the one or more minimum values and updating the check nodes may cause the processor to determine the one or more minimum values by executing a single instruction on a plurality of candidate blocks.

According to an exemplary embodiment of the LDPC encoding method of the present invention, the processing speed of the encoder may be greatly improved through a data level parallelization and a use of a vector operator. In addition, the LDPC encoding method is highly scalable enough to handle all code types specified in the 5G NR Technical specification, for example and may take full advantage of the software solution.

According to an embodiment of the LDPC decoding method of the present invention, the processing speed may be improved by compromising the increase in a calculation amount and reducing a number of iterations through a data level parallelization.

Experiments have shown that the encoding method according to the present invention achieved an improvement in the processing speed by 2.46 times compared with an existing method. Also, the decoding method according to the present invention has shown the improvement in the processing speed by 486.8 times compared with the existing method.

BRIEF DESCRIPTION OF THE DRAWINGS

In order that the disclosure may be well understood, there will now be described various forms thereof, given by way of example, reference being made to the accompanying drawings, in which:

FIG. 2 is a block diagram showing a physical configuration of a communication node according to an exemplary embodiment of the present disclosure;

FIG. 3 is a functional block diagram of the communication node according to an exemplary embodiment of the present disclosure;

FIG. 7 is a flowchart showing a process of calculating parity sequences according to an exemplary embodiment;

FIG. 9 is a functional block diagram of an exemplary embodiment of an LDPC decoder shown in FIG. 3;

FIG. 12 shows an example of a decoding algorithm according to an exemplary embodiment in which a linear-time parallelization technique is applied;

Figure 1:
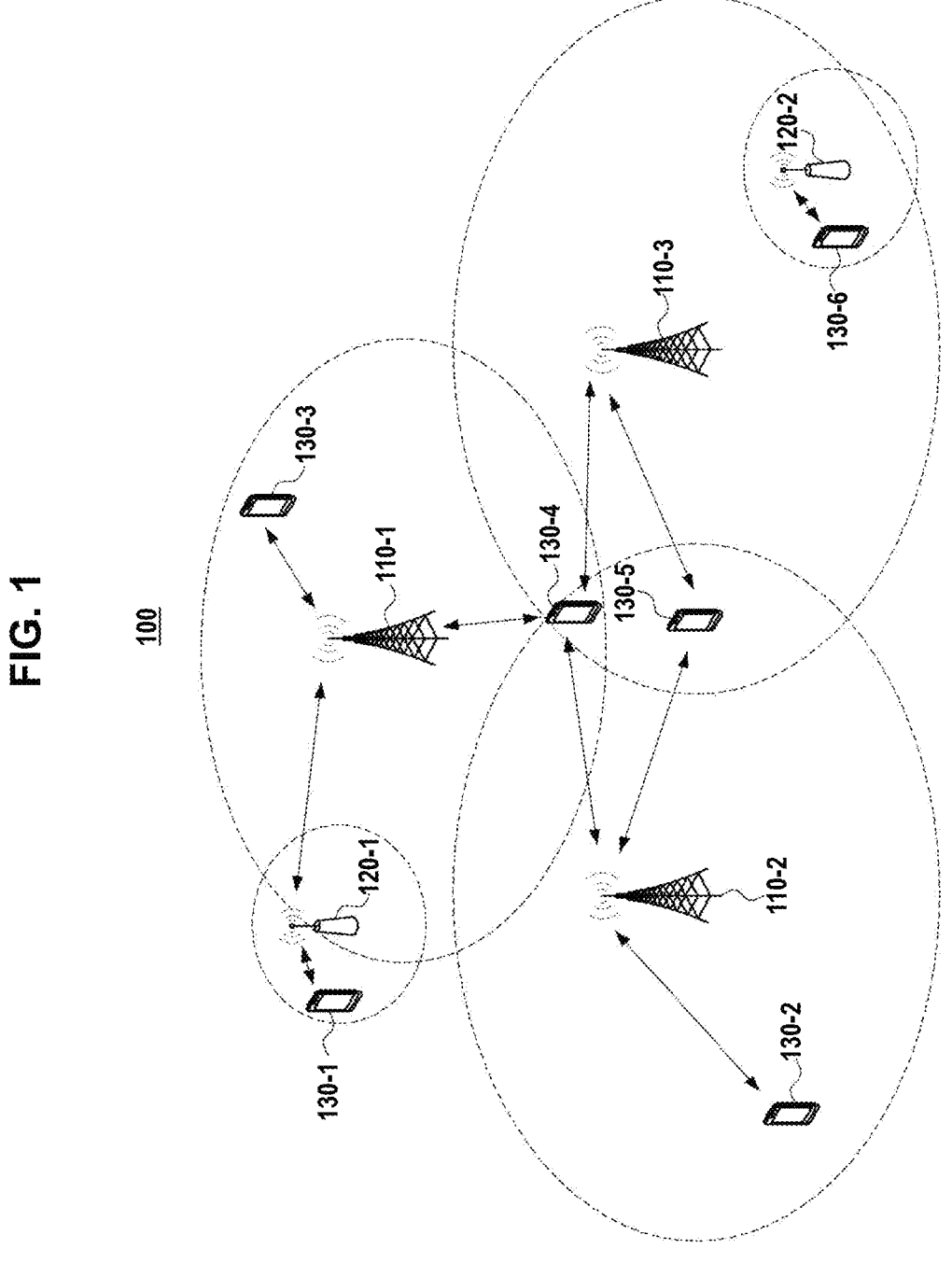
FIG. 1 is a schematic diagram of a communication system to which exemplary embodiments of the present invention are applicable.

The drawings described herein are for illustration purposes only and are not intended to limit the scope of the present disclosure in any way.

DETAILED DESCRIPTION

For a clearer understanding of the features and advantages of the present disclosure, exemplary embodiments of the present disclosure will be described in detail with reference to the accompanied drawings. However, it should be understood that the present disclosure is not limited to particular embodiments disclosed herein but includes all modifica-
tions, equivalents, and alternatives falling within the spirit
and scope of the present disclosure.

The terminologies including ordinals such as "first" and
"second" designated for explaining various components in
this specification are used to discriminate a component from
the other ones but are not intended to be limiting to a specific
component. For example, a second component may be
referred to as a first component and, similarly, a first
component may also be referred to as a second component
without departing from the scope of the present disclosure.
As used herein, the term "and/or" may include a presence of
one or more of the associated listed items and any and all
combinations of the listed items.

In the description of exemplary embodiments of the
present disclosure, "at least one of A and B" may mean "at
least one of A or B" or "at least one of combinations of one
or more of A and B". In addition, in the description of
exemplary embodiments of the present disclosure, "one or
more of A and B" may mean "one or more of A or B" or "one
or more of combinations of one or more of A and B".

When a component is referred to as being "connected" or
"coupled" to another component, the component may be
directly connected or coupled logically or physically to the
other component or indirectly through an object therebe-
tween. Contrarily, when a component is referred to as being
"directly connected" or "directly coupled" to another com-
ponent, it is to be understood that there is no intervening
object between the components. Other words used to
describe the relationship between elements should be inter-
preted in a similar fashion.

The terminologies are used herein for the purpose of
describing particular exemplary embodiments only and are
not intended to limit the present disclosure. The singular
forms include plural referents as well unless the context
clearly dictates otherwise. Also, the expressions "com-
prises," "includes," "constructed," "configured" are used to
refer a presence of a combination of stated features, num-
bers, processing steps, operations, elements, or components,
but are not intended to preclude a presence or addition of
another feature, number, processing step, operation, ele-
ment, or component.

Unless defined otherwise, all terms used herein, including
technical or scientific terms, have the same meaning as
commonly understood by those of ordinary skill in the art to
which the present disclosure pertains. Terms such as those
defined in a commonly used dictionary should be interpreted
as having meanings consistent with their meanings in the
context of related literatures and will not be interpreted as
having ideal or excessively formal meanings unless explic-
itly defined in the present application.

Exemplary embodiments of the present disclosure will
now be described in detail with reference to the accompa-
nying drawings. In order to facilitate general understanding
in describing the present disclosure, the same components in
the drawings are denoted with the same reference signs, and
repeated description thereof will be omitted.

FIG. 1 is a schematic diagram of a communication system
to which exemplary embodiments of the present invention
are applicable. The communication system 100 shown in
FIG. 1 may include a plurality of communication nodes
110-1, 110-2, 110-3, 120-1, 120-2, 130-1, 130-2, 130-3,
130-4, 130-5, and 130-6. The plurality of communication
nodes may support at least one of communication protocols
defined in the 3rd generation partnership project (3GPP)
technical specifications such as LTE communication proto-
col, LTE-A communication protocol, NR communication protocol, or the like. However, the communication systems
to which the exemplary embodiments according to the
present invention are applicable are not limited thereto, and
the present invention may be applied to various communi-
cation systems. Here, the communication system may be
used in the same sense as a communication network. The
term 'LTE' may refer to '4G communication system', 'LTE
communication system', or 'LTE-A communication sys-
tem', and 'NR' may refer to '5G communication system' or
'NR communication system'.

For the 4G communication and the 5G communication,
the plurality of communication nodes may support code
division multiple access (CDMA) based communication
protocol, wideband CDMA (WCDMA) based communica-
tion protocol, time division multiple access (TDMA) based
communication protocol, frequency division multiple access
(FDMA) based communication protocol, orthogonal fre-
quency division multiplexing (OFDM) based communica-
tion protocol, filtered OFDM based communication proto-
col, cyclic prefix OFDM (CP-OFDM) based communication
protocol, discrete Fourier transform-spread-OFDM (DFT-s-
OFDM) based communication protocol, orthogonal fre-
quency division multiple access (OFDMA) based commu-
nication protocol, single carrier FDMA (SC-FDMA) based
communication protocol, non-orthogonal multiple access
(NOMA) based communication protocol, generalized fre-
quency division multiplexing (GFDM) based communica-
tion protocol, filter band multi-carrier (FBMC) based com-
munication protocol, universal filtered multi-carrier
(UFMC) based communication protocol, space division
multiple access (SDMA) based communication protocol, or
the like, for example.

Each of the plurality of communication 110-1, 110-2,
110-3, 120-1, 120-2, 130-1, 130-2, 130-3, 130-4, 130-5, and
130-6 may operate as a base station or a terminal. For
example, the communication system 100 may include a
plurality of base stations 110-1, 110-2, 110-3, 120-1, and
120-2, and a plurality of terminals 130-1, 130-2, 130-3,
130-4, 130-5, and 130-6.

The communication system 100 including the base sta-
tions 110-1, 110-2, 110-3, 120-1, and 120-2 and the termi-
nals 130-1, 130-2, 130-3, 130-4, 130-5, and 130-6 may be
referred to as a wireless access network. Each of the first
base station 110-1, the second base station 110-2, and the
third base station 110-3 may form a macro cell, and each of
the fourth base station 120-1 and the fifth base station 120-2
may form a small cell. The fourth base station 120-1, the
third terminal 130-3, and the fourth terminal 130-4 may
belong to the cell coverage of the first base station 110-1.
Also, the second terminal 130-2, the fourth terminal 130-4,
and the fifth terminal 130-5 may belong to the cell coverage
of the second base station 110-2. Also, the fifth base station
120-2, the fourth terminal 130-4, the fifth terminal 130-5,
and the sixth terminal 130-6 may belong to the cell coverage
of the third base station 110-3. Also, the first terminal 130-1
may belong to the cell coverage of the fourth base station
120-1, and the sixth terminal 130-6 may belong to the cell
coverage of the fifth base station 120-2.

The communication system 100 may further include a
core network (not shown). In case that the communication
system 100 is a 4G communication system (e.g., the LTE
system), the core network may include a serving gateway
(S-GW), a packet data network (PDN) gateway (P-GW), and
a mobility management entity (MME). In case that the
communication system 100 is a 5G communication system
(e.g., the NR system), the core network may include an access and mobility management function (AMF), a user plane function (UPF), a session management function (SMF), and the like.

Each of the plurality of base stations 110-1, 110-2, 110-3, 120-1, and 120-2 may be referred to as a Node B (NB), evolved NodeB (eNB), gNB, advanced base station (ABS), high reliability-base station (HR-BS), base transceiver station (BTS), radio base station, radio transceiver, access point (AP), access node, radio access station (RAS), mobile multihop relay-base station (MMR-BS), relay station (RS), advanced relay station (ARS), high reliability-relay station (HR-RS), home NodeB (HNB), home eNodeB (HeNB), road side unit (RSU), radio remote head (RRH), transmission point (TP), transmission and reception point (TRP), or the like.

Each of the plurality of base stations 110-1, 110-2, 110-3, 120-1, and 120-2 may operate in the same frequency band or in different frequency bands. The plurality of base stations 110-1, 110-2, 110-3, 120-1, and 120-2 may be connected to each other via an ideal backhaul link or a non-ideal backhaul link to exchange information with each other via the ideal or non-ideal backhaul. Each of the plurality of base stations 110-1, 110-2, 110-3, 120-1, and 120-2 may be connected to the core network through the ideal backhaul link or non-ideal backhaul link. Each of the plurality of base stations 110-1, 110-2, 110-3, 120-1, and 120-2 may transmit a signal received from the core network to the corresponding terminal 130-1, 130-2, 130-3, 130-4, 130-5, or 130-6, and transmit a signal received from the corresponding terminal 130-1, 130-2, 130-3, 130-4, 130-5, or 130-6 to the core network.

Each of the plurality of terminals 130-1, 130-2, 130-3, 130-4, 130-5, and 130-6 may perform operations corresponding to the operations of the plurality of base stations 110-1, 110-2, 110-3, 120-1, and 120-2 (i.e., the operations supported by the plurality of base stations 110-1, 110-2, 110-3, 120-1, and 120-2). Each of the plurality of terminals 130-1, 130-2, 130-3, 130-4, 130-5, and 130-6 may be referred to as user equipment (UE), terminal equipment (TE), advanced mobile station (AMS), high reliability-mobile station (HR-MS), terminal, access terminal, mobile terminal, station, subscriber station, mobile station, portable subscriber station, node, device, mounted module/device/terminal, on-board unit (OBU), or the like.

At least some of the terminals may perform device-to-device (D2D) communications through a sidelink under a control of a base station. For example, each of the base stations 110-1, 110-2, and 110-3 may control D2D communications between the fourth terminal 130-4 and the fifth terminal 130-5, and thus the fourth terminal 130-4 and the fifth terminal 130-5 may perform the D2D communications under control of the second base station 110-2 and the third base station 110-3.

In the communication system 100 of FIG. 1, each communication node may perform the channel coding when transmitting data to a communication counterpart node. In particular, in case that the communication system 100 is an NR communication system, the communication node may perform the source coding by use of a polar code for control signals transmitted and received through control channels while using a low-density parity check (LDPC) code for payload data transmitted and received through shared channels. That is, the communication node may transmit message data encoded by the LDPC code to allow the communication counterpart node to detect and correct an error introduced in the channel. In addition, the communication node may receive data encoded by the LDPC code to detect and correct an error in the received message data by decoding according to the LDPC code.

FIG. 2 is a block diagram showing a physical configuration of a communication node according to an exemplary embodiment of the present disclosure. The communication node 200 may include a processor 210, a memory 220, a storage 230, and a data transceiver. In addition, the communication node 200 may further include an input interface device 250 and an output interface device 260. The components of the communication node 200 may be connected to each other by a bus.

The processor 210 may execute program instructions stored in the memory 220 or the storage 230 to perform the LDPC encoding and the LDPC decoding according to the present disclosure. The processor 210 may include a central processing unit (CPU) and/or may be implemented to include another kind of dedicated processor and/or an acceleration processor suitable for performing the method of the present disclosure. The processor 210 may execute program instructions for implementing the LDPC encoding and decoding method according to the present invention. In particular, according to exemplary embodiments, the processor 200 may perform parallel processing of a single instruction multiple data (SIMD) operation type in a single processor core or in a plurality of processor cores. In particular, the processor 200 may perform SIMD operations by executing instructions of an Advanced Vector Extension (AVX)-512 instruction set.

The memory 220 may include, for example, a volatile memory such as a read only memory (ROM) and a non-volatile memory such as a random access memory (RAM). The memory 220 may load the program instructions stored in the storage 230 to provide to the processor 210 so that the processor 210 may execute the program instructions. In particular, according to the present invention, the memory 220 may temporarily store data generated in a course of the execution of the LDPC encoding or decoding such as a base graph, a parity check matrix, message data, parity bits, processing data at check nodes and variable nodes, log-likelihood radio (LLR) data, posterior probability data, and decision results which will be described later in addition to the program instructions.

The storage 230 may include an intangible recording medium suitable for storing the program instructions, data files, data structures, and a combination thereof. Examples of the storage medium may include magnetic media such as a hard disk, a floppy disk, and a magnetic tape, optical media such as a compact disk read only memory (CD-ROM) and a digital video disk (DVD), magneto-optical medium such as a floptical disk, and semiconductor memories such as ROM, RAM, a flash memory, and a solid-state drive (SSD). The storage 230 may store the program instructions for implementing the LDPC encoding and decoding according to exemplary embodiments. In addition, the storage 230 may store data that needs to be stored for a long time, which may include a base graph and/or a parity check matrix.

FIG. 3 is a functional block diagram of the communication node according to an exemplary embodiment of the present disclosure. As mentioned above, the communication node may be a base station or a terminal. The communication node may include a data transmitter 310 and a data receiver 320.

The data transmitter 310 may include an LDPC encoder 312 and a modulator 314. The LDPC encoder 312 may encode message data to be transmitted to the counterpart node according to an LDPC code and output an encoded codeword. The modulator 312 may modulate the codeword to generate a modulated signal. The modulated signal may be transmitted to the counterpart node through a communication channel. In an exemplary embodiment, the LDPC encoder 312 may be implemented by program instructions executed by the processor 210 shown in FIG. 2. That is, in the exemplary embodiment, the LDPC encoding may performed by the software. In particular, according to an exemplary embodiment, the LDPC encoder 312 may perform multiplication and addition operations on a plurality of bits in a unit of a block of a certain length by performing the SIMD operations through executions of the AVX-512 instructions. Meanwhile, the modulator 312 may be implemented by the hardware, e.g., a modem chip included in the data transceiver 240 shown in FIG. 2.

The data receiver 320 may include a demodulator 322 and an LDPC decoder 324. The demodulator 324 may receive a modulated signal from the counterpart node through a communication channel and demodulate the received signal to output a demodulated signal. The LDPC decoder 324 may receive the demodulated signal and perform the LDPC decoding to output reconstructed message data. The LDPC decoder 324 may repeatedly perform the decoding operation by a certain number of repetition times. For example, the LDPC decoder 324 may perform operations of updating of a check node, updating of a variable node, a hard decision of an encoded bit, and a termination decision based on LLR values. A message passing algorithm and a belief propagation algorithm (BPA) may be used to decode the LDPC codewords. In an exemplary embodiment, the LDPC decoder 324 may be implemented by the program instructions executed by the processor 210 shown in FIG. 2. That is, in the exemplary embodiment, the LDPC decoding may performed by the software. Meanwhile, the demodulator 322 may be implemented by the hardware, e.g., the modem chip included in the data transceiver 240 shown in FIG. 2.

Figure 4:
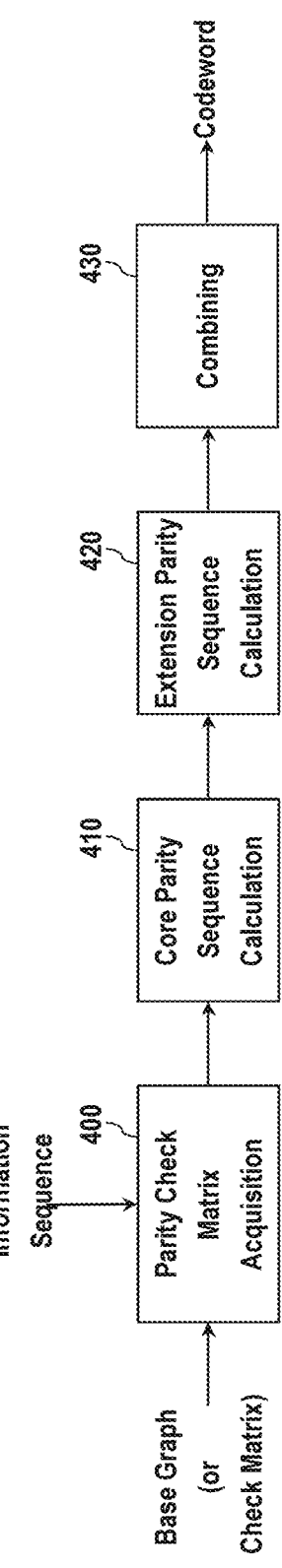
FIG. 4 is a functional block diagram of an exemplary embodiment of an LDPC encoder shown in FIG. 3.

FIG. 4 is a functional block diagram of an exemplary embodiment of the LDPC encoder 312 shown in FIG. 3. The LDPC encoder 312 may include a parity check matrix acquirer 400, a core parity sequence calculator 410, an extension parity sequence calculator 420, and a parity sequence combiner 430.

The parity check matrix acquirer 400 may receive an information sequence to be LDPC-encoded. In an exemplary embodiment, the information sequence may be a message sequence itself that the user wishes to send. Alternatively, however, the information sequence may be the message sequence added by a transport block cyclic redundancy code (CRC). Meanwhile, the parity check matrix acquirer 400 may acquire a parity check matrix according to a size of the information sequence and a code rate. In an exemplary embodiment, the parity check matrix may be calculated in advance based on the base graph and stored in the memory 220 or the storage device 230. Alternatively, the parity check matrix acquirer 400 may construct the parity check matrix by replacing each element of the base graph by a matrix in a predetermined manner while loading the base graph stored in the memory 220 or the storage device 230.

The core parity sequence calculator 410 may generate a core parity sequence to be attached to the information sequence based on the parity check matrix. The extension parity sequence calculator 420 may generate an extension parity sequence to be attached to the information sequence based on the parity check matrix. The parity sequence combiner 430 may generate a codeword by attaching the core parity sequence and the extension parity sequence to the information sequence.

Figure 5:
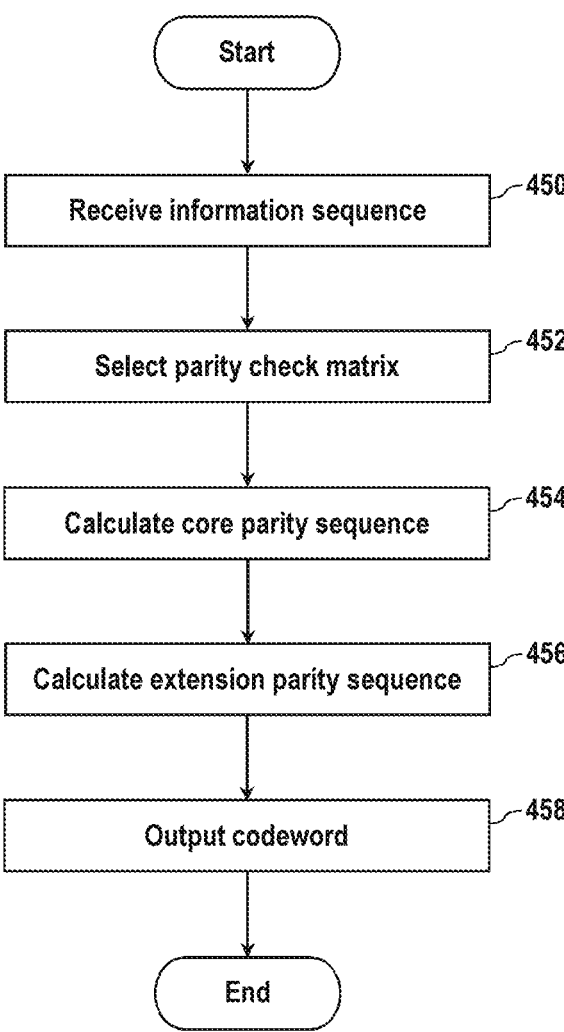
FIG. 5 is a flowchart showing an overall encoding process in the LDPC encoder of FIG. 4.

FIG. 5 is a flowchart showing an overall encoding process in the LDPC encoder 312 of FIG. 4.

First, after receiving the information sequence to be encoded (operation 450), the parity check matrix acquirer 400 may select a base graph to be used for the encoding of the information sequence based on the size of the information sequence and the code rate. The parity check matrix acquirer 400 may determine a parity check matrix corresponding to a selected base graph (operation 452). Alternatively, the parity check matrix acquirer 400 may construct the parity check matrix by replacing each element of the base graph with a matrix in a manner described below while loading the base graph stored in the memory 220 or the storage device 230. In another alternative embodiment, the parity check matrix acquirer 400 may select, based on the size of the information sequence and the code rate, one of a plurality of parity check matrices generated correspondingly to each of the base graphs and various lifting sizes and stored in the storage device 230.

After the parity check matrix is determined, the core parity sequence calculator 410 may generate the core parity sequence to be attached to the information sequence based on the parity check matrix (operation 454). The extension parity sequence calculator 420 may generate the extension parity sequence to be attached to the information sequence based on the parity check matrix (operation 456). The parity sequence combiner 430 may generates the codeword by attaching the core parity sequence and the extension parity sequence to the information sequence to output the generated codeword (operation 458).

Hereinbelow, the process of calculating the parity sequences according to an exemplary embodiment will be described in more detail.

Figure 6:
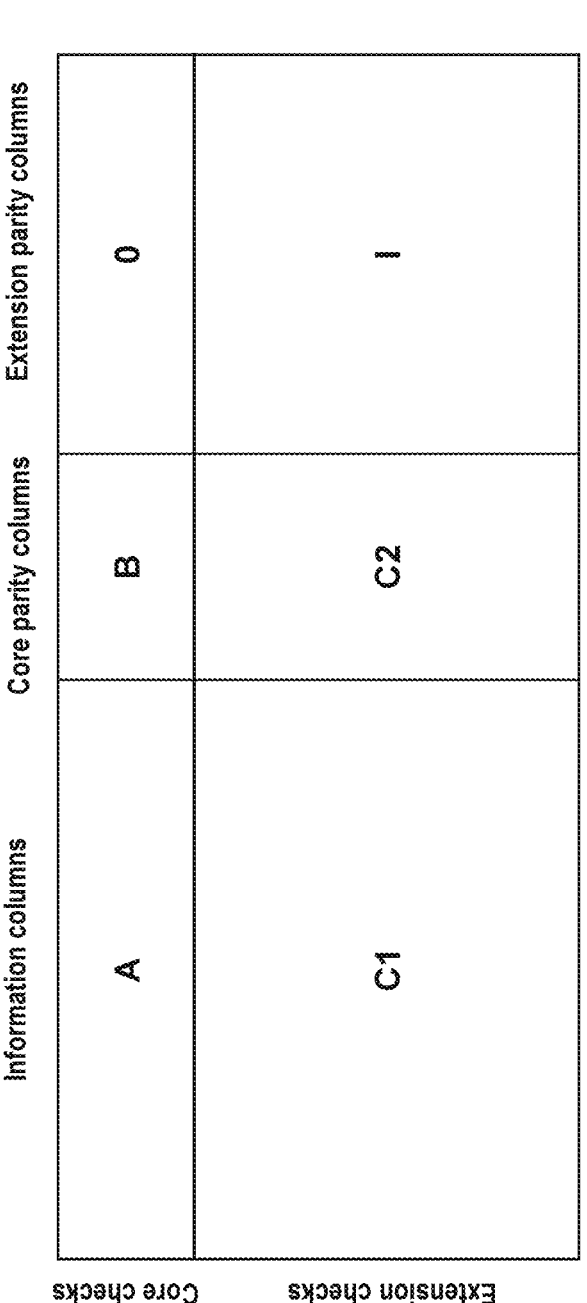
FIG. 6 shows a structure of a base graph block used in the 5G NR communication system.

FIG. 6 shows a structure of a base graph block used in the 5G NR communication system. The Technical Specification (TS) 38.212 set by 3GPP specifies two base graphs, i.e., base graph 1 with 46 rows and 68 columns, and base graph 2 with 42 rows and 52 columns. Depending on the size of the information sequence and the code rate, one of the two base graphs may be used. The parity check matrix may be obtained by replacing each element of the base graph by a replacement matrix having a dimension of Z×Z. At this time, each element of a value of −1 in the base graph is replaced by an all zero matrix. Each element of a value 0 is replaced by an identity matrix. Each element of a value other than −1 and 0 are replaced by a circular permutation matrix obtained by circularly shifting the identity matrix by a number of times corresponding to a value of the element. At this time, the Z value determining the dimension of the substitution matrices replacing each element is referred to as a lifting size. The lifting size may be determined by one of 51 numbers. The lifting size determines a maximum value of each element in the base graph, and thus determines the number of shifts in the circular permutation matrix also. Therefore, depending on the selection of the base graph and the lifting size, the parity check matrix may have various dimensions.

As shown in FIG. 6, columns of the base graph may be divided into information columns, core parity columns, and extension parity columns, and rows of the base graph may be divided into core check rows and extension check rows. Accordingly, regardless of the dimension of the base graph, the base graph may be partitioned into six small matrices, which may be denoted by A, B, O, C1, C2, and I.

For the input information sequence, the core parity sequence and the extension parity sequence may be determined such that a following equation 1 is satisfied. Here, H denotes the parity check matrix. The Equation 1 may be expressed in a form of Equation 2.

$$HC^T = 0^T \qquad \text{[Equation 1]}$$

$$\begin{bmatrix} A & B & 0 \\ C_1 & C_2 & I \end{bmatrix} \begin{bmatrix} s \\ p_a \\ p_b \end{bmatrix} = 0^T \qquad \text{[Equation 2]}$$

Here, 's' denotes bits of the information sequence of which number of bits is $k_b * Z$. '$p_a$' denotes core parity bits, i.e., the core parity sequence, of which number of bits is $4*Z$. '$p_b$' denotes extension parity bits, i.e., the extension parity sequence.

The Equation 2 can be divided into Equation 3 and Equation 4. The Equation 3 is associated with the core parity sequence, and the Equation 4 is associated with the extension parity sequence.

$$A_s^T + B p_a^T + 0 p_c^T = 0^T \qquad \text{[Equation 3]}$$

$$C_1 s^T + C_2 p_a^T + I p_c^T = 0^T \qquad \text{[Equation 4]}$$

The Equation 3 associated with the core parity sequence may be rearranged into Equation 5.

$$\begin{bmatrix} a_{1,1} & a_{1,2} & \cdots & a_{1,k_b} \\ a_{2,1} & a_{2,2} & \cdots & a_{2,k_b} \\ a_{3,1} & a_{3,2} & \ddots & a_{3,k_b} \\ a_{4,1} & a_{4,2} & \cdots & a_{4,k_b} \end{bmatrix} \begin{bmatrix} s_1 \\ s_2 \\ \vdots \\ s_{k_b} \end{bmatrix} + \begin{bmatrix} 1 & 0 & -1 & -1 \\ 0 & 0 & 0 & -1 \\ -1 & -1 & 0 & 0 \\ 1 & -1 & -1 & 0 \end{bmatrix} \begin{bmatrix} p_{a_1} \\ p_{a_2} \\ p_{a_3} \\ p_{a_4} \end{bmatrix} = 0 \qquad \text{[Equation 5]}$$

The Equation 5 may be expanded into Equation 6.

$$\sum_{j=1}^{k_b} a_{1,j} s_j + p_{a_1}^{(1)} + p_{a_2} = 0 \qquad \text{[Equation 6]}$$

$$\sum_{j=1}^{k_b} a_{2,j} s_j + p_{a_1} + p_{a_2} + p_{a_3} = 0$$

$$\sum_{j=1}^{k_b} a_{3,j} s_j + p_{a_3} + p_{a_4} = 0$$

$$\sum_{j=1}^{k_b} a_{4,j} s_j + p_{a_1}^{(1)} + p_{a_4} = 0$$

Here, $s_i$ and $p_{a_i}$ are vectors with a length of Z bits. $s_j^{(i)}$ is a vector obtained by circularly shifting the vector $s_j$ to the right by i times.

The core parity sequence may be obtained by solving the Equation 6 as follows.

$$p_{a_1} = \sum_{i=1}^{4} \lambda_i \qquad \text{[Equation 7]}$$

$$p_{a_2} = \lambda_2 + p_{a_1}^{(1)}$$

$$p_{a_3} = \lambda_3 + p_{a_4}$$

$$p_{a_4} = \lambda_4 + p_{a_1}^{(1)}$$

-continued where $\lambda_i = \sum_{j=1}^{k_b} a_{i,j} s_j$.

Similarly, the extension parity sequence may be obtained by solving the Equation 4 as follows.

$$P_{c_1} = \sum_{j=1}^{k_b} c_{1,j} s_j + \sum_{j=1}^{g} c_{1,k_b+j} P_{a_j} \qquad \text{[Equation 8]}$$

$$P_{c_2} = \sum_{j=1}^{k_b} c_{2,j} s_j + \sum_{j=1}^{g} c_{2,k_b+j} P_{a_j}$$

$$\vdots$$

$$p_{c_{m_b-g}} = \sum_{j=1}^{k_b} c_{m_b-g,j} s_j + \sum_{j=1}^{g} c_{m_b-g,k_b+j} P_{a_j}$$

where $g = 4$.

The Equations 3-7 follow the notation described in a paper T. T. B. Nguyen, et al., "Efficient QC-LDPC Encoder for 5G New Radio," Electronics 2019. While the paper discloses an LDPC encoder implemented in hardware, i.e., on a semiconductor integrated circuit using CMOS technology, exemplary embodiments of the present invention provides an LDPC encoder implemented in software. In particular, principal unit operations in the calculation of the core parity sequence and the extension parity sequence may be executed by parallel processing in the processor 210 according to exemplary embodiments of the present disclosure.

Figure 8:
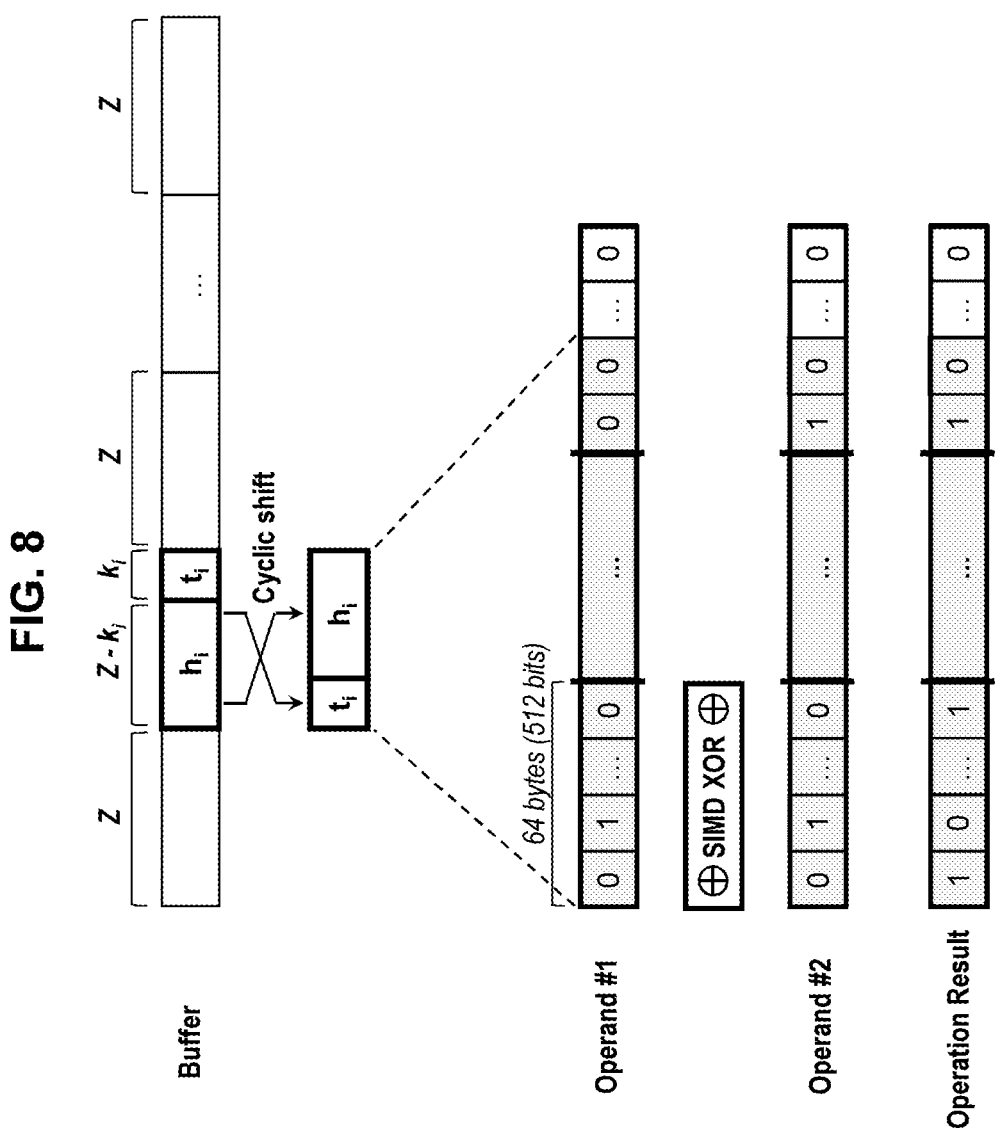
FIG. 8 is a conceptual diagram showing operations of calculating the parity sequences by the parallel processing.

FIG. 7 is a flowchart showing a process of calculating the parity sequences according to an exemplary embodiment. FIG. 8 is a conceptual diagram showing operations of calculating the parity sequences by the parallel processing.

First, the information sequence to be encoded is stored in a buffer 550 (operation 500). The buffer may be implemented in the memory 220 or a memory cache provided in the processor 230.

Next, the information sequence stored in the buffer 550 is sequentially segmented in a unit of a certain length (operation 510). In FIG. 8, the length of each segmented information sequence is indicated by 'Z', which may be the same as the lifting size.

Subsequently, multiplication and addition operations between elements of vectors or matrices are performed by cyclic shift operations and exclusive-OR (XOR) operations for each segmented information sequence (operations 520 and 530). An example of performing the operations on a second segmented information sequence among a plurality of segmented information sequences is shown in the drawing.

For example, in the Equation 7 for obtaining the core parity sequence, $\lambda_i(=\sum_{j=1}^{k_b} a_{i,j} s_j)$ may be calculated by summing $a_{i,j} s_j$ components for all values of j. Each $a_{i,j} s_j$ component may correspond to a data sequence obtained by circularly-shifting $s_j$ to the right using a shift coefficient defined by the coefficient $a_{i,j}$. Accordingly, in an exemplary embodiment, a multiplication of two matrix elements may be implemented by selective shift operations. That is, according to an exemplary embodiment, a multiplication of each element of the segmented information sequence by an element of the parity check matrix is replaced by an operation of selectively circularly-shifting elements of the segmented information sequence by a number of times corresponding to a value of the element of the parity check matrix. This shift operation may be accomplished by circularly shifting a current segmented information sequence before performing addition operations. FIG. 8 shows an example of cyclically shifting the second segmented information sequence, which is the current segmented information sequence, by hi bits as a whole.

Meanwhile, the addition operation, i.e. a MOD-2 addition, may be performed by an XOR operation. In particular, the summation operation denoted by sigma operator may be performed by multiple XOR operations or a cumulative XOR operation. The XOR operation may be executed in a unit of a predetermined parallelization length. For example, in case of performing a SIMD operation using instructions in the AVX-512 instruction set, 64 bytes, i.e., 512 bits, of data may be loaded into a register at once, and the XOR operation may be performed on the 512 bits of data simultaneously.

As such, the multiplication and addition operations between the elements of two vectors or matrices may be performed by a cyclic shift operation and XOR operations according to an exemplary embodiment (operation 520). At this time, in case that the replacement matrix at the corresponding position of the parity check matrix is the all-zero matrix, the multiplication and addition are ignored. In case that the replacement matrix is a unit matrix, the value of each element of the segmented information sequence is maintained, i.e., accumulated as it is. In case of the other replacement matrices, the multiplication and addition may be performed by shifting the data by a number of times corresponding to the replacement matrix and then performing the XOR operations.

Although above description was provided in terms of a calculation of $\lambda_i$, other multiplication and addition operations between elements of two vectors or matrices may also be performed in the same manner. Meanwhile, when the operations on a segmented information sequence of length Z is completed, operations on a next segmented information sequence may be initiated. The operation for each segmented information sequence may continue until the operation for a last segmented information sequence is completed. In the case of the last segmented information sequence, the operation may be performed after adjusting the length of the segmented information sequence to Z by padding zeroes at the end of the segmented information sequence, if necessary (operation 530).

$\lambda_i$ and the core parity bit $p_{a_1} \sim p_{a_4}$ in Equation 7 may be derived through such operations.

The extension parity sequence may also be derived in a similar manner. That is, the $c_{i,j} s_j$ component in Equation 8 may correspond to a data sequence obtained by circularly-shifting $s_j$ to the right using a shift coefficient defined by the coefficient $c_{i,j}$. Also, the $c_{1,k_b} {}^{,j} P_{a_j}$ component may correspond to a data sequence obtained by circularly-shifting $p_{a_j}$ to the right using a shift coefficient defined by the coefficient $c_{1,k_b} {}^{,j}$. Accordingly, the $c_{i,j} s_j$ and $C_{1,k_b} {}^{,j} P_{a_j}$ components may be obtained by shift operations, and the extension parity bits $p_{c_1} \sim p_{cm_{b-g}}$ may be derived by summing the values for all the components.

Finally, the encoded codeword may be obtained by combining the core parity bits and extension parity bits to the original message, i.e., the information sequence (operation 540).

As described above, according to an exemplary embodiment, the multiplication and addition operations between the elements of two vectors or matrices may be performed by cyclic shift operations and XOR operations, and the parity bits in the LDPC encoding may be calculated through such operations according to an exemplary embodiment of the present disclosure. In particular, the operations are accelerated through vector operators supporting the data level parallelization, i.e., SIMD LOAD and SIMD XOR.

Figure 9:
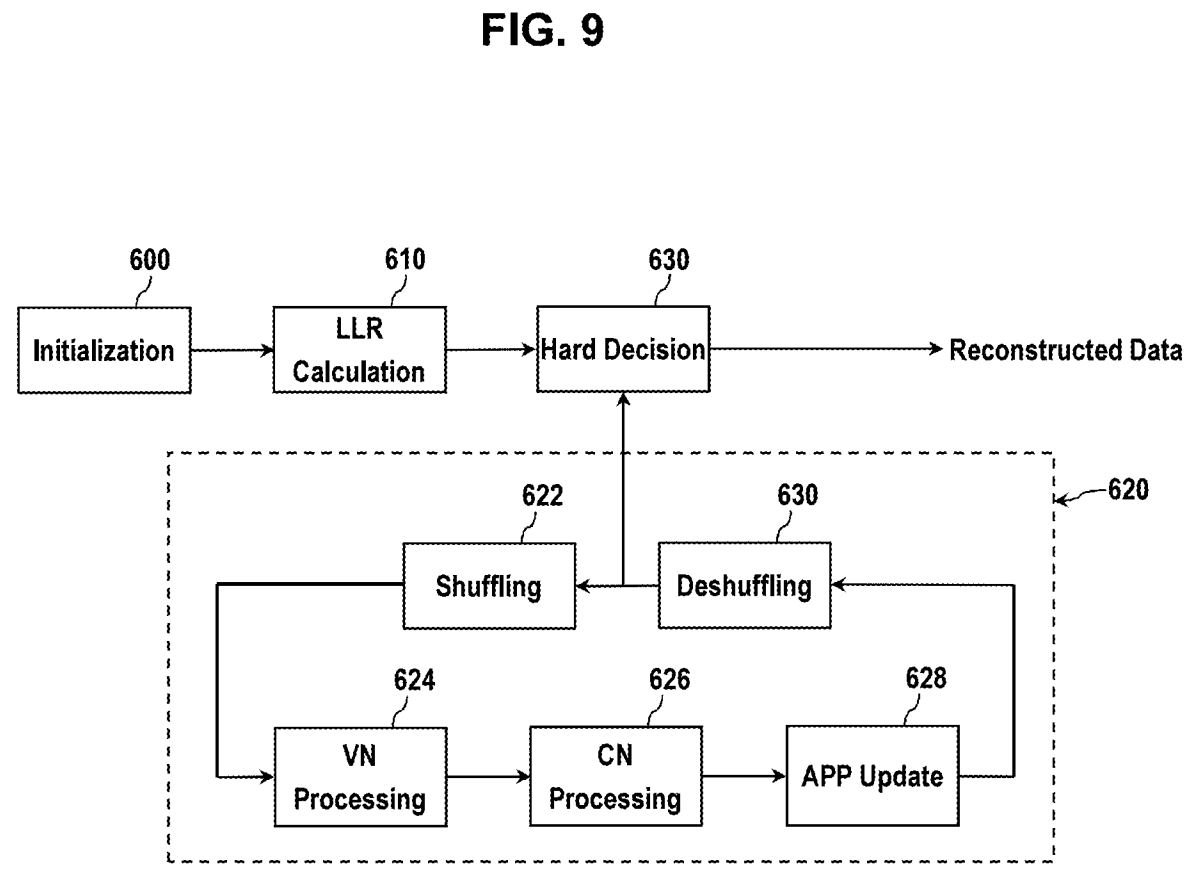

FIG. 9 is a functional block diagram of an exemplary embodiment of the LDPC decoder 324 shown in FIG. 3. The LDPC decoder 324 may include an initialization unit 600, an LLR calculation unit 610, an iterative processing unit 620, and a hard decision unit 640. The LDPC decoder 324 shown in FIG. 9 decodes the received data according to a layered MIN-SUM algorithm, for example. However, the present invention is not limited thereto, and other algorithms may be used as well.

The initialization unit 600 may initialize parameters and arrays used in the LDPC decoder 324. The initialization may be carried out with reference to the LLR value obtained by the LLR calculation unit 610. The LLR calculation unit 610 calculates the log-likelihood ratio (LLR) values for the demodulated symbols output by the demodulator 322. In addition, the LLR calculation unit 610 may convert a data format of the LLR value from a floating point format to an 8-bit long fixed point format. The iterative processing unit 620 repeatedly carries out a variable node processing, a check node processing, and a calculation of a posteriori probability (APP) value. The hard decision unit 612 may determine a decoding result value based on the APP value derived by the iterative processing unit 620.

The iterative processing unit 620 may include a shuffling unit 622, a variable node processor 624, a check node processor 626, an APP updater 628, and a deshuffling unit 630. The iterative processing unit 620 sequentially and repeatedly performs the variable node processing (VNP), the check node processing (CNP), and an updating of the APP value to obtain and save an updated APP value corresponding to a current layer. In such processes, the LDPC decoder 324 may process data, in parallel, as much as a size of the vector of a SIMD extension according to an exemplary embodiment of the present disclosure.

The shuffling unit 622 may shuffle the probability values from the LLR calculation unit 610 according to a certain rule or pattern to enhance a decoding efficiency. The variable node processor 624 may perform operations of updating of the probability values according to certain rules. The check node processor 626 may perform operations of updating check nodes by calculating a minimum value and a sign of the probability value based on the messages from the variable nodes. The APP updater 628 may calculate the posterior probability (APP) values based on V2C messages provided by the variable nodes to the check nodes and C2V messages provided by the check nodes to the variable nodes. The deshuffling unit 630 may deshuffle posterior probability values according to a certain rule or pattern. While repeatedly performing the variable node processing, the check node processing, and the calculation of the posteriori probability (APP) values, the iterative processing unit 620 enables exchanges of the LLR values and relevant messages between the variable nodes and the check nodes and updates of the posterior probability values by the APP updater 628.

Figure 10:
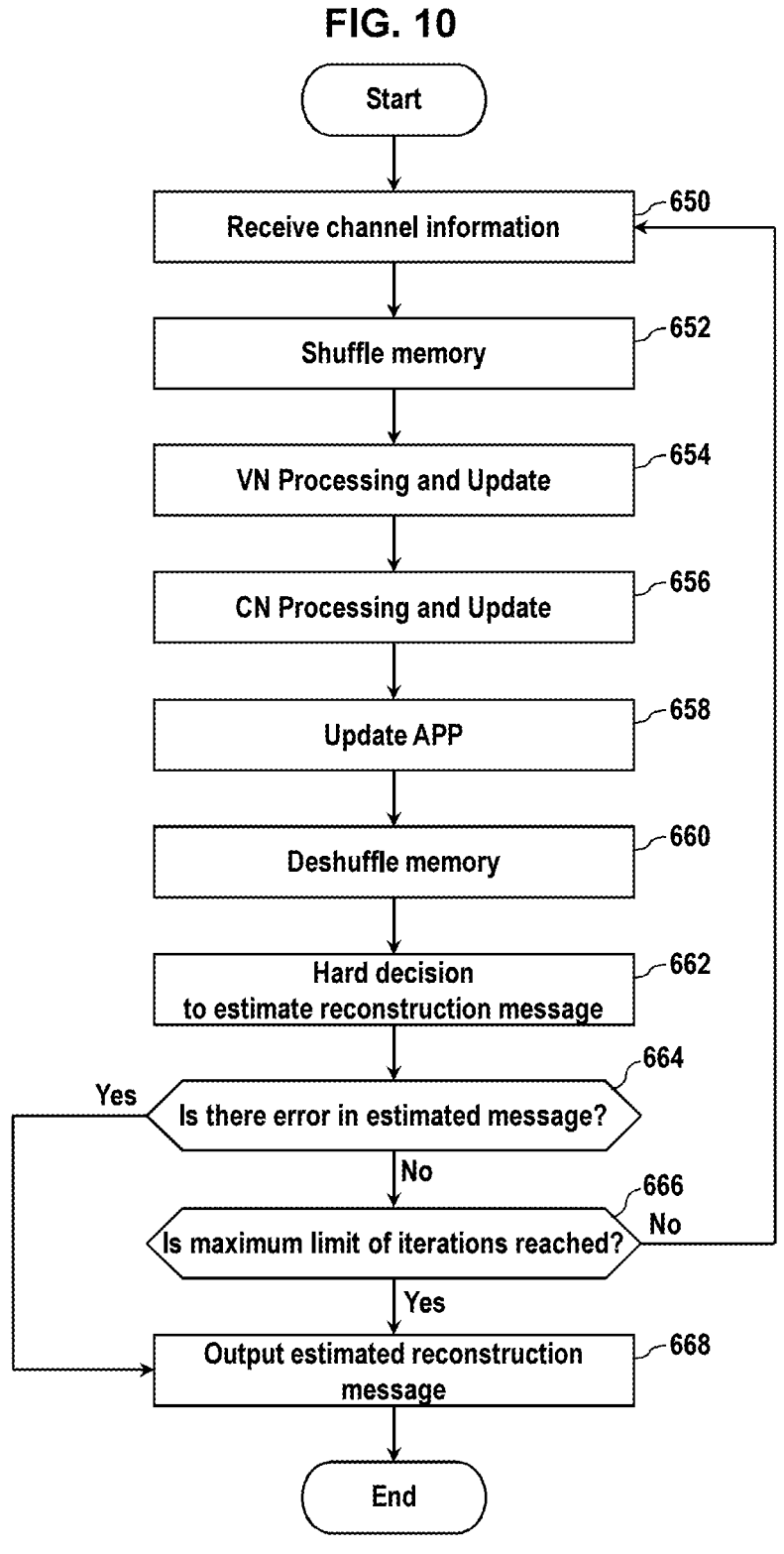
FIG. 10 is a flowchart showing an overall decoding process in an LDPC decoder of FIG. 9.

FIG. 10 is a flowchart showing an overall decoding process in the LDPC decoder 324 of FIG. 9. The decoding operation of the LDPC codeword may be performed by the LDPC decoder 324 shown in FIG. 3. The operations of the LDPC decoder 324 may be performed by the processor 210 shown in FIG. 2.

First, an initialization and an operation of receiving channel information may be performed (operation 650). The initialization may refer to an initialization of the various parameters and the arrays including all the messages in the decoder. Once the initialization is completed, the channel information may be received. The channel information may refer to demodulated samples, i.e., an encoded codeword obtained by demodulating the signal received through the channel.

If the channel information is received after the initialization is completed, iterative decoding operations (operations 652-666) may be performed. The iterative decoding operations may include a memory shuffling operation (operation 652), a variable node processing and updating operation (operation 654), a check node processing and updating operation (operation 656), a posterior probability updating operation (operation 658), and a memory deshuffling operation (operation 660), a hard decision and reconstructed message estimation operation (operation 662), and a determination of terminating the decoding operation (operations 664-666). The operations 652-666 may be performed repeatedly until an error-free message is reconstructed or an early termination condition is satisfied.

Specifically, in the operation 652, received information may be shuffled and sorted in the memory.

After memory alignment is completed, the variable node (VN) processing and the check node (CN) processing are performed (operations 654-656), and the variable nodes and the check nodes may be updated accordingly. After the update of the variable nodes and the check nodes is completed, the posterior probability (APP) value may be updated (operation 658).

After the generation of the APP is completed, the decoder may deshuffle the memory (operation 660) and generate the estimated message by performing the hard decision based on the deshuffled data (operation 662).

Afterwards, the decoder may determine whether the decoding process is to be terminated early based on an estimated reconstruction message (operation 664). An early termination of the decoding process may be achieved when it is determined that there is no error in the estimated reconstruction message and the decoding process has been successfully completed. In one embodiment, an error in the estimated reconstruction message may be found by checking the CRC. Alternatively, the existence of the error in the estimated reconstruction message may be determined based on a syndrome between the estimated reconstruction message obtained by the hard decision and the parity check matrix. An example of a syndrome check result may be a determination of whether $\hat{y}_v H^T = 0$ or not, where $\hat{y}_v$ denotes the estimated reconstruction message, and H denotes the parity check matrix. If it is determined in the operation 664 that there is no error in the estimated reconstruction message, the estimated reconstruction message may be output and the decoding process may be terminated early (operation 668).

Meanwhile, if it is determined in the operation 664 that there is an error in the estimated reconstruction message, it may be determined whether a maximum limit of iterations has been reached (operation 666). If it is determined in the operation 666 that the maximum limit of iterations has been reached, the reconstruction message may be output and the decoding process may be terminated (operation 668). If it is determined in the operation 666 that the maximum limit of iterations has not been reached, the process proceeds again to the operation 652, so that the operations 652-666 may be performed again. Meanwhile, in addition to or instead of whether the maximum limit of iterations has been reached, the early termination may be determined based on a change in a sign of the decoded data. In such an embodiment, the decoder may check whether there is a change between the sign of the decoded data in the iteration and the sign of the decoded data in the current iteration. In case that there is no change in the sign for all decoded data, the iterative decoding process may be terminated.

Figure 11:
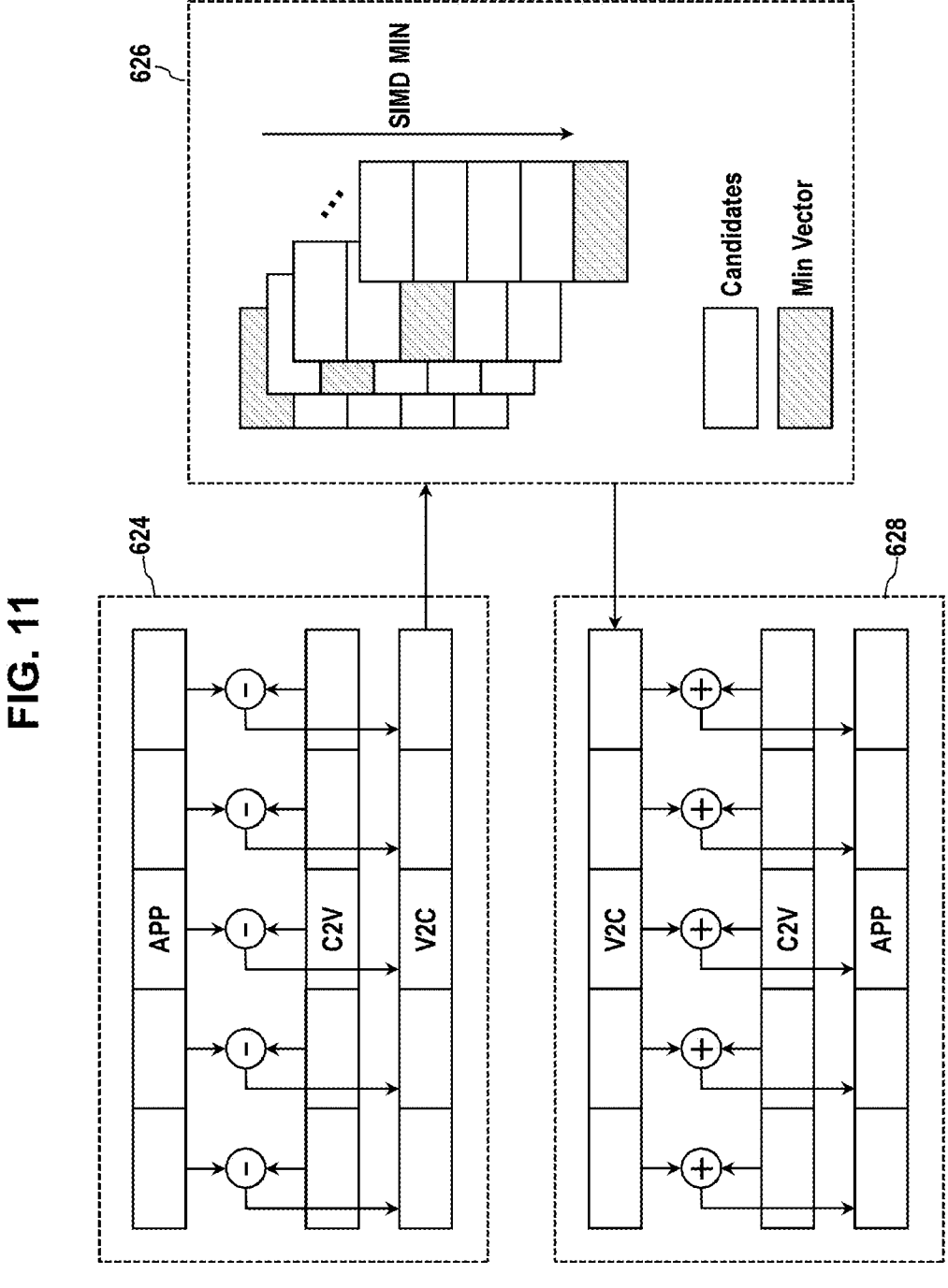
FIG. 11 is a functional block diagram of an iterative processing unit for explaining a data level parallelization technique in the LDPC decoder according to an exemplary embodiment.

FIG. 11 is a functional block diagram of the iterative processing unit 620 for explaining a data level parallelization technique in the LDPC decoder 324 according to an exemplary embodiment. For simplicity, the shuffling unit 622 and the deshuffling unit 630 shown in FIG. 9 are not shown in FIG. 11. FIG. 12 shows an example of a decoding algorithm according to an exemplary embodiment in which a linear-time parallelization technique is applied.

In each iteration, variable nodes update variables and then send the variable-to-check (V2C) messages containing updated variables to the check nodes. Also, the check nodes perform predetermined processing and send check-to-variable (C2V) messages containing processing results to the variable nodes. The V2C messages and the C2V messages may be expressed as messages exchanged between the variable nodes and the check nodes in a Tanner graph. The V2C messages and the C2V messages may also be used to calculate the posterior probability (APP) by the APP updater 628. As mentioned above, such iterative decoding operations may be performed only within a predetermined maximum number of times.

The variable node processor 624 may update the variable node values based on the C2V messages sent by the check nodes to the variable nodes and the APP values updated by the APP updater 628. In other words, the variable node processor 624 may generate new V2C messages to be sent to the check nodes based on the C2V messages and the APP values updated by the APP updater 628. Each of the updated V2C messages may be generated by additions and multiplications of all or some of the other neighboring edge messages of the corresponding variable node, and the APP values may be reflected in the generation of the updated V2C messages. The updated V2C messages may be propagated to the check node processor 626 and the APP updater 628. At this time, the variable node processor 624 may perform a layered decoding and the parallel processing for multiple nodes in the Tanner graph while performing vector operations.

The check node processor 626 searches for a minimum error probability for a plurality of blocks in each iteration. In particular, according to an exemplary embodiment of the present invention, the check node processor 626 may search for a vector that causes the minimum error probability for a plurality of candidate blocks at once by using a SIMD MIN operation among the AVX-512 instructions. As shown in FIG. 12, the check node processor 626 may extract absolute values and signs of probability values included in the V2C messages, and determine a first and a second minimum of the probability values based on the extracted absolute values and signs. The check node processor 626 may propagate the first and the second minimum of the probability values to the variable node processor 624 and the APP updater 628 through the C2V messages denoted by 'BM' in the algorithm of FIG. 12. According to the present disclosure, the check node processing (CNP) which takes the most time in the decoding process is implemented to be performed in linear-time using the vector operators.

The APP updater 628 may update the posterior probability (APP) values based on the C2V messages and the V2C messages. The updated posterior probability values may be used to make the hard decision on the decoding result as mentioned above.

Figure 13:
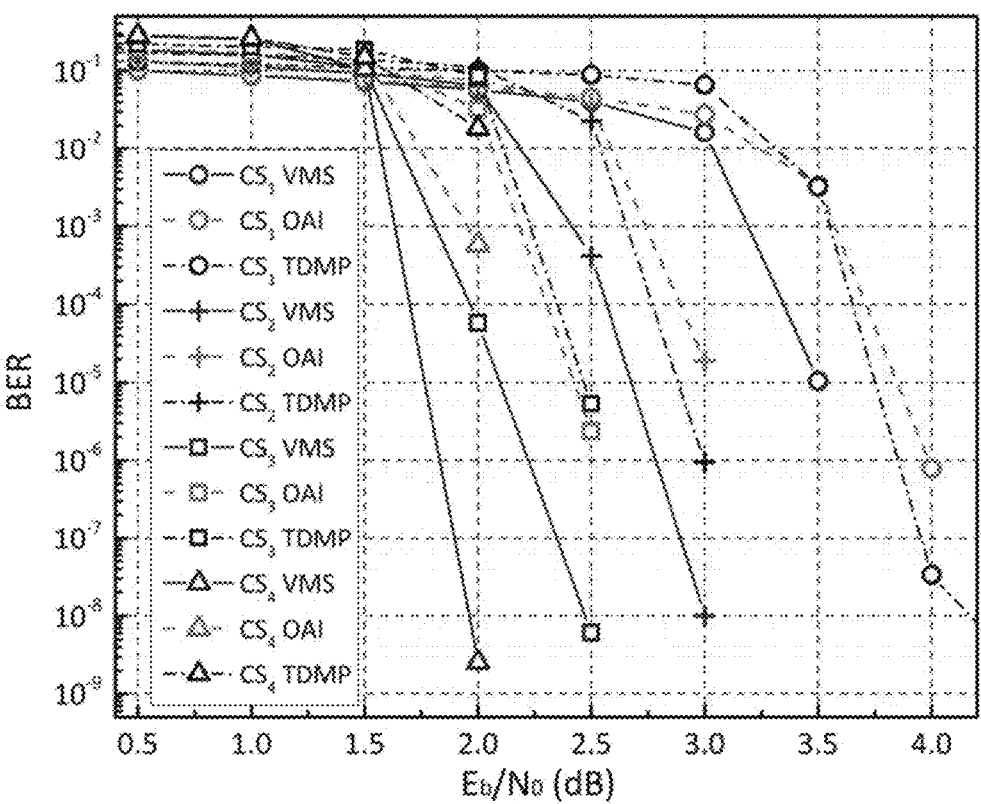
FIG. 13 is a graph showing error correction performance of an encoding and decoding device according to an exemplary embodiment in an AWGN channel environment.

FIG. 13 is a graph showing error correction performance of an encoding and decoding device according to an exemplary embodiment in an AWGN channel environment. In the drawing, lines labeled with 'CSi VMS' indicate the performance of the encoding and decoding device according to the present disclosure. Simulation results in case of decoding by use of an OpenAir (OAI) open source software solution and a TDMP algorithm are also shown for comparison. As a result of checking the error correction performance while increasing a signal-to-noise ratio (SNR), it was found that the software-based encoding and decoding device of the present invention using the layered decoding algorithm shows a performance improvement of about 0.5 dB compared to other comparison groups.

Figure 14:
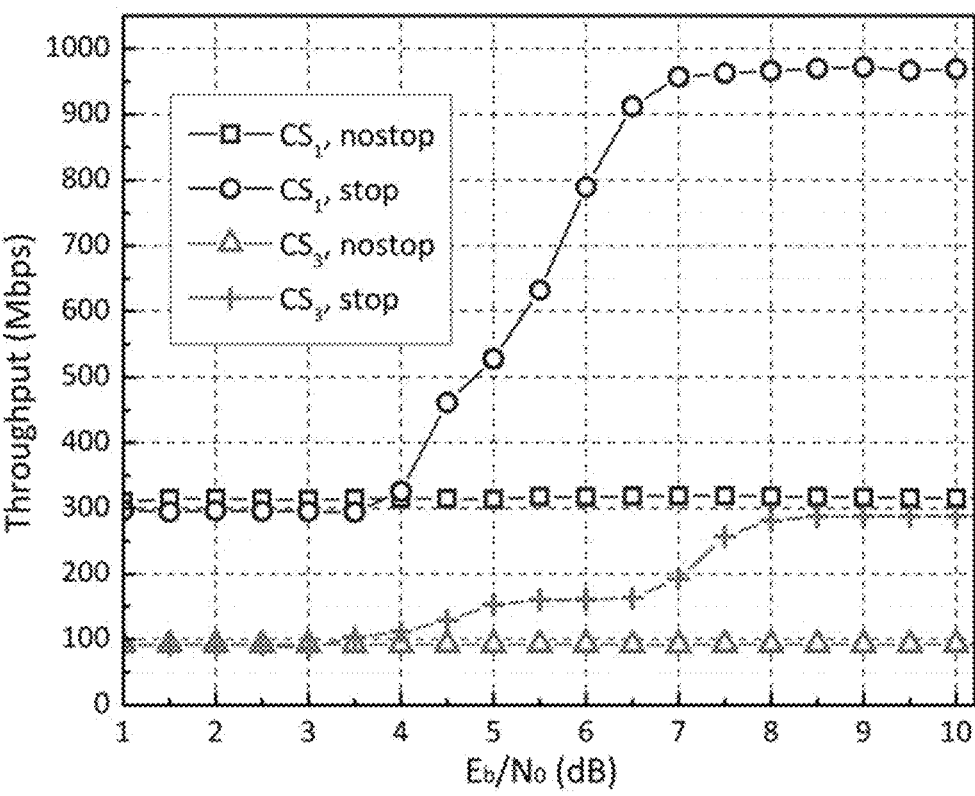
FIG. 14 is a graph showing decoding results in case of using SIMD operator-based early termination algorithm according to an exemplary embodiment.

FIG. 14 is a graph showing decoding results in case of using the SIMD operator-based early termination algorithm according to an exemplary embodiment. It can be seen that, in regions where the SNR is high, a fewer iterations may result in a similar error correction capability, and the processing speed is improved by nearly three times.

Figure 15:
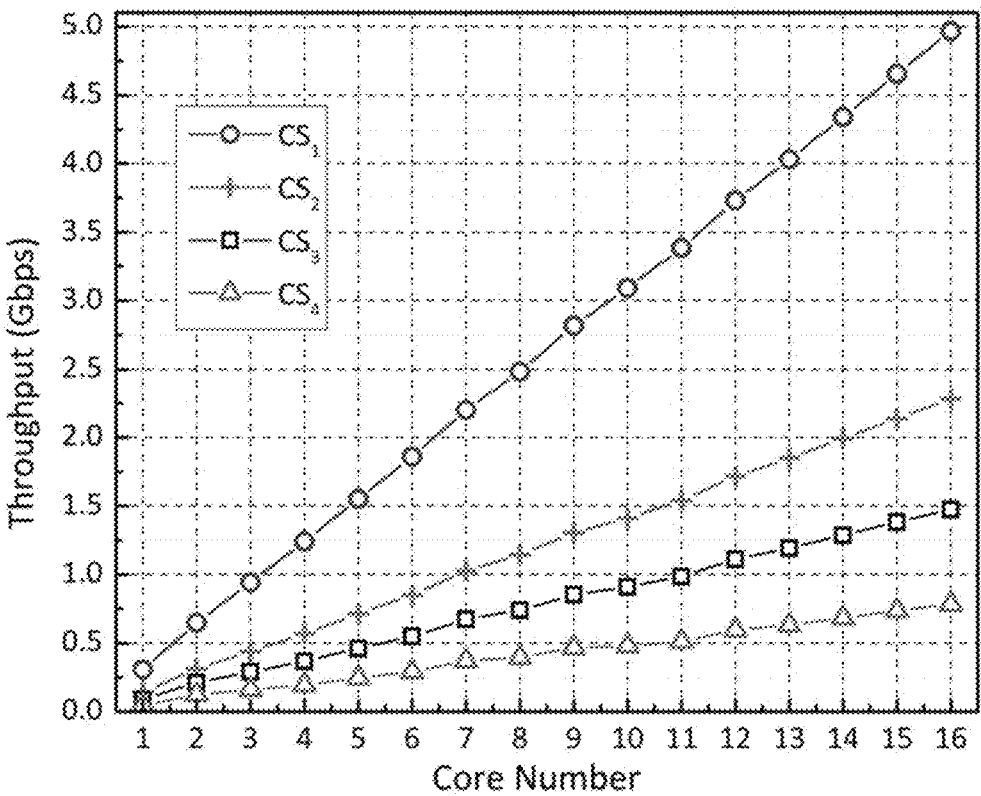
FIG. 15 is a graph showing processing speeds of a vector operator-based software decoder according to a number of cores in a processor.

FIG. 15 is a graph showing the processing speed of the vector operator-based software decoder according to a number of cores in a processor when the decoding is performed using all of the cores in the processor. The processor used in the experiment was Xeon Gold 5218, which has 16 processor cores. It can be seen that the processing speed increases linearly according to the number of the cores engaged in the operation. In case of decoding by use of all the 16 cores, a decoding processing speed of up to 4.8 Gbps was achieved.

The apparatus and method according to exemplary embodiments of the present disclosure can be implemented by computer-readable program codes or instructions stored on a computer-readable intangible recording medium. The computer-readable recording medium includes all types of recording device storing data which can be read by a computer system. The computer-readable recording medium may be distributed over computer systems connected through a network so that the computer-readable program or codes may be stored and executed in a distributed manner.

The computer-readable recording medium may include a hardware device specially configured to store and execute program instructions, such as a ROM, RAM, and flash memory. The program instructions may include not only machine language codes generated by a compiler, but also high-level language codes executable by a computer using an interpreter or the like.

Some aspects of the present disclosure described above in the context of the device or apparatus may indicate corresponding descriptions of the method according to the present disclosure, and the blocks or devices may correspond to operations of the method or features of the operations. Similarly, some aspects described in the context of the method may be expressed by features of blocks, items, or devices corresponding thereto. Some or all of the operations of the method may be performed by use of a hardware device such as a microprocessor, a programmable computer, or electronic circuits, for example. In some exemplary embodiments, one or more of the most important operations of the method may be performed by such a device.

In some exemplary embodiments, a programmable logic device such as a field-programmable gate array may be used to perform some or all of functions of the methods described herein. In some exemplary embodiments, the field-programmable gate array may be operated with a microprocessor to perform one of the methods described herein. In general, the methods are preferably performed by a certain hardware device.

The description of the disclosure is merely exemplary in nature and, thus, variations that do not depart from the substance of the disclosure are intended to be within the scope of the disclosure. Such variations are not to be regarded as a departure from the spirit and scope of the disclosure. Thus, it will be understood by those of ordinary skill in the art that various changes in form and details may be made without departing from the spirit and scope as defined by the following claims.

What is claimed is:

1. A method of encoding data according to a low-density parity check code (LDPC) performed by a communication apparatus, the method comprising:
   receiving an information sequence to be encoded;
   segmenting the information sequence into blocks of a predetermined length;
   deriving parity bits for each of the segmented blocks by using a predetermined parity check matrix;
   generating a codeword by combining the parity bits into a corresponding segmented block; and
   transmitting a signal comprising the codeword on a communication channel,
   wherein deriving parity bits for each of the segmented blocks comprises:
   performing multiplications with at least one element of the parity check matrix by circularly shifting the segmented block a number of times corresponding to the at least one element of the parity check matrix; and
   performing XOR operations on a plurality of bits of a circularly-shifted segmented block in parallel.

2. The method of claim 1, wherein receiving the information sequence to be encoded comprises:
   storing at least one of the segmented blocks of the predetermined length in a buffer through a vector operator supporting a data level parallelization.

3. The method of claim 1, wherein the vector operator is a SIMD LOAD instruction of an Advanced Vector Extension (AVX)-512 instruction set.

4. A method of encoding and decoding data according to a low-density parity check code (LDPC) performed by a communication apparatus, the method comprising:
   receiving an information sequence to be encoded;
   segmenting the information sequence into blocks of a predetermined length;
   deriving parity bits for each of the segmented blocks by using a predetermined parity check matrix;
   generating a codeword by combining the parity bits into a corresponding segmented block;
   transmitting a signal comprising the codeword on a communication channel;
   receiving a demodulated sample of a signal received through a communication channel; and
   decoding the demodulated sample,
   wherein deriving parity bits for each of the segmented blocks comprises:
   performing multiplications with at least one element of the parity check matrix by circularly shifting the segmented block a number of times corresponding to the at least one element of the parity check matrix; and
   performing XOR operations on a plurality of bits of a circularly-shifted segmented block in parallel.

5. The method of claim 4, wherein receiving the information sequence to be encoded comprises:

storing at least one of the segmented blocks of the predetermined length in a buffer through a vector operator supporting a data level parallelization.

6. The method of claim 5, wherein the vector operator is a SIMD LOAD instruction of an Advanced Vector Extension (AVX)-512 instruction set.

7. The method of claim 4, wherein decoding the demodulated sample comprises:

updating variable nodes based on LLR values obtained for a plurality of received blocks;

determining one or more minimum values among a plurality of updated variable node values and updating check nodes;

deriving an posterior probability (APP) value based on information about the one or more minimum values; and determining a decoding result based on the APP value.

8. The method of claim 7, wherein determining the one or more minimum values and updating the check nodes comprises:

determining the one or more minimum values by executing a single instruction on a plurality of candidate blocks.

9. The method of claim 8, wherein an execution of the single instruction on the plurality of candidate blocks is performed by an execution of an SIMD MIN instruction of an AVX-512 instruction set.

10. A device of encoding and decoding data according to a low-density parity check code (LDPC) in a communication apparatus, comprising:

a processor; and a memory storing at least one instruction to be executed by the processor, wherein the at least one instruction when executed by the processor causes the processor to:

receive an information sequence to be encoded;

segment the information sequence into blocks of a predetermined length;

derive parity bits for each of the segmented blocks by using a predetermined parity check matrix;

generate a codeword by combining the parity bits into a corresponding segmented block; and transmit a signal comprising the codeword on a communication channel, wherein the instruction causing the processor to derive parity bits for each of the segmented blocks comprises instructions causing the processor to:

perform multiplications with at least one element of the parity check matrix by circularly shifting the segmented block a number of times corresponding to the at least one element of the parity check matrix; and perform XOR operations on a plurality of bits of a circularly-shifted segmented block in parallel.

11. The device of claim 10, wherein the instruction causing the processor to receive the information sequence to be encoded causes the processor to:

store at least one of the segmented blocks of the predetermined length in a buffer through a vector operator supporting a data level parallelization.

12. The device of claim 11, wherein the vector operator is a SIMD LOAD instruction of an Advanced Vector Extension (AVX)-512 instruction set.

13. The device of claim 10, wherein the at least one instruction when executed by the processor further causes the processor to:

receive a demodulated sample of a signal received through a communication channel; and decode the demodulated sample.

14. The device of claim 13, wherein the instruction causing the processor to decode the demodulated sample comprises instructions causing the processor to:

update variable nodes based on LLR values obtained for a plurality of received blocks;

determine one or more minimum values among a plurality of updated variable node values and updating check nodes;

derive an posterior probability (APP) value based on information about the one or more minimum values; and determine a decoding result based on the APP value.

15. The device of claim 14, wherein the instruction causing the processor to determine the one or more minimum values and updating the check nodes causes the processor to:

determine the one or more minimum values by executing a single instruction on a plurality of candidate blocks.

* * * * *